United States Patent
Yu et al.

(10) Patent No.: US 7,799,630 B2
(45) Date of Patent: Sep. 21, 2010

(54) METHOD FOR MANUFACTURING A CMOS DEVICE HAVING DUAL METAL GATE

(75) Inventors: Chih-Hao Yu, Tainan County (TW);
Li-Wei Cheng, Hsin-Chu (TW);
Tian-Fu Chiang, Taipei (TW);
Cheng-Hsien Chou, Tainan (TW);
Chien-Ting Lin, Hsin-Chu (TW);
Che-Hua Hsu, Hsin-Chu Hsien (TW);
Guang-Hwa Ma, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 145 days.

(21) Appl. No.: 12/018,214

(22) Filed: Jan. 23, 2008

(65) Prior Publication Data
US 2009/0186458 A1    Jul. 23, 2009

(51) Int. Cl.
*H01L 21/8238* (2006.01)
(52) U.S. Cl. ............... 438/230; 438/652; 257/E21.474
(58) Field of Classification Search .............. 438/230, 438/283, 573, 652; 257/E21.474
See application file for complete search history.

(56) References Cited

U.S. PATENT DOCUMENTS

| 6,573,134 | B2 | 6/2003 | Ma |
| 6,696,333 | B1 * | 2/2004 | Zheng et al. ............... 438/230 |
| 7,157,378 | B2 | 1/2007 | Brask et al. |
| 7,208,361 | B2 | 4/2007 | Shah et al. |
| 7,229,873 | B2 * | 6/2007 | Colombo et al. ............ 438/231 |
| 2007/0037343 | A1 | 2/2007 | Colombo |

FOREIGN PATENT DOCUMENTS

CN    1378269 A    11/2002

* cited by examiner

*Primary Examiner*—W. David Coleman
(74) *Attorney, Agent, or Firm*—Winston Hsu

(57) ABSTRACT

A method for manufacturing a CMOS device having dual metal gate includes providing a substrate having at least two transistors of different conductive types and a dielectric layer covering the two transistors, planarizing the dielectric layer to expose gate conductive layers of the two transistors, forming a patterned blocking layer exposing one of the conductive type transistor, performing a first etching process to remove a portion of a gate of the conductive type transistor, reforming a metal gate, removing the patterned blocking layer, performing a second etching process to remove a portion of a gate of the other conductive type transistor, and reforming a metal gate.

55 Claims, 7 Drawing Sheets

METHOD FOR MANUFACTURING A CMOS DEVICE HAVING DUAL METAL GATE

BACKGROUND OF THE INVENTION

1. Field of the Invention

The invention relates to a method for manufacturing a complementary metal-oxide semiconductor (CMOS) device having a dual metal gate, and more particularly, to a method for manufacturing a CMOS device applied with a gate last process.

2. Description of the Prior Art

With a trend towards scaling down the CMOS size, conventional methods used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus double work function metals are used to replace the conventional polysilicon gate to be the control electrode that competent to the high-K gate dielectric layer.

One of the double work function metal gates is used in an NMOS device and the other one is alternatively used in a PMOS device. It is well-known that compatibility and process control for the dual metal gate are more complicated, meanwhile thickness and composition controls for materials used in the dual metal gate method are more precise. The conventional dual metal gate methods are categorized into gate first process and gate last process. In a conventional dual metal gate method applied with the gate first process, the anneal process for forming the source/drain ultra-shallow junction, and the silicide process are performed after forming the metal gate. After the anneal process having such strict heat budget, it is found that a flat band voltage ($V_{fb}$) does not increase or decrease linearly with decrease of EOT of the high-K gate dielectric layer. Instead, a roll-off issue is observed.

Therefore, the gate last process is developed to improve the $V_{fb}$ roll-off issue and avoid generating leakage current due to re-crystallization of the high-K gate dielectric layer happened in high-temperature processes, and to widen material choices for the high-K gate dielectric layer and the metal gate in the gate first process.

SUMMARY OF THE INVENTION

It is therefore a primary objective of the claimed invention to provide a method for manufacturing a CMOS device having dual metal gate applied with gate last process.

According to the claimed invention, a method for manufacturing a CMOS device having dual metal gate is provided. The method includes steps of providing a substrate having a first conductive type transistor, a second conductive type transistor, and a dielectric layer covering the first conductive type transistor and the second conductive type transistor formed thereon; planarizing the dielectric layer to expose gate conductive layers of a first gate of the first conductive type transistor and of a second gate of the second conductive type transistor; forming a patterned blocking layer covering the second conductive type transistor and exposing the first conductive type transistor on the substrate; performing a first etching process to remove the gate conductive layer of the first gate to form a first opening; sequentially forming a first metal layer and a second metal layer in the first opening; removing the patterned blocking layer covering the second conductive type transistor; performing a second etching process to remove the gate conductive layer of the second gate to form a second opening; and sequentially forming a third metal layer and a fourth metal layer in the second opening.

According to the method for manufacturing a CMOS device having dual metal gate provided by the present invention, the transistors are fabricated with the gate last process. Since high-temperature processes have already finished before constructing the metal gates of the transistors, the provided method is more applicable to form the transistor needed to avoid high heat budget. Accordingly $V_{fb}$ roll-off issue is improved and material choice for the metal gate is widened.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
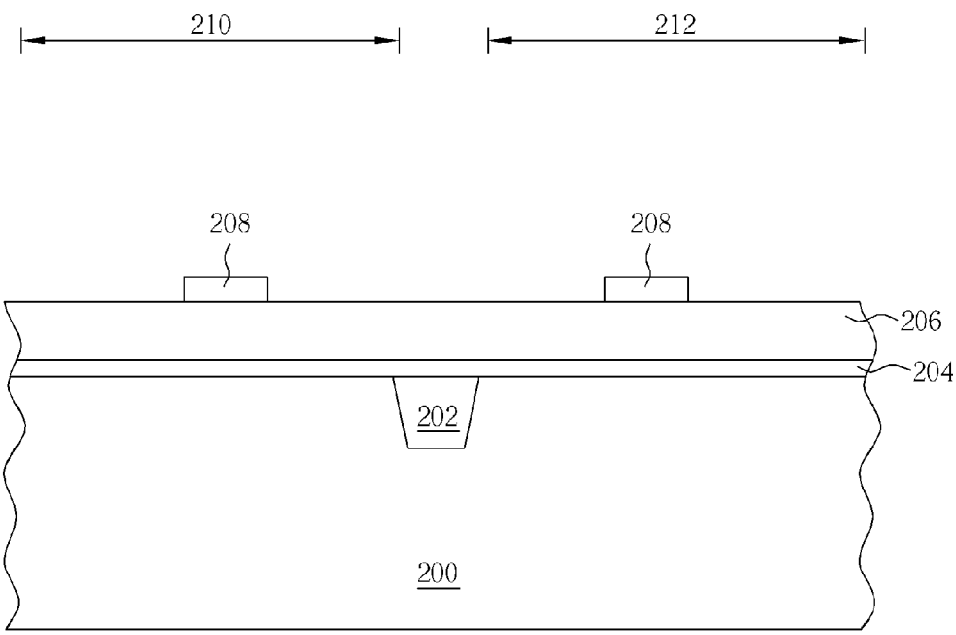
FIGS. 1-13 are schematic drawings illustrating a method for manufacturing a CMOS device having dual metal gate according to a preferred embodiment of the present invention.

Please refer to FIGS. 1-13, which are schematic drawings illustrating a method for manufacturing a CMOS device having dual metal gate according to a preferred embodiment of the present invention. As shown in FIG. 1, a substrate 200 such as a silicon substrate, a silicon-containing substrate, or a silicon-on-insulator (SOI) substrate, having a first active region 210 and a second active region 212 defined thereon is provided. The substrate 200 further comprises a shallow trench isolation (STI) 202 used to provide an electrical isolation between the first active region 210 and the second active region 212. Then, a gate dielectric layer 204, a gate conductive layer such as a polysilicon layer 206, a hard mask layer (not shown) are sequentially formed on the substrate 200. The gate dielectric layer 204 can be a silicon oxide layer or a silicon oxynitride layer; it also can be a high-K dielectric layer. In addition, a cap layer (not shown) or an ARC layer (not shown) can be selectively formed on the substrate 200. Next, a photolithographic and etching process is performed to pattern the hard mask layer to obtain a patterned hard mask layer 208 as shown in FIG. 1.

Figure 2:
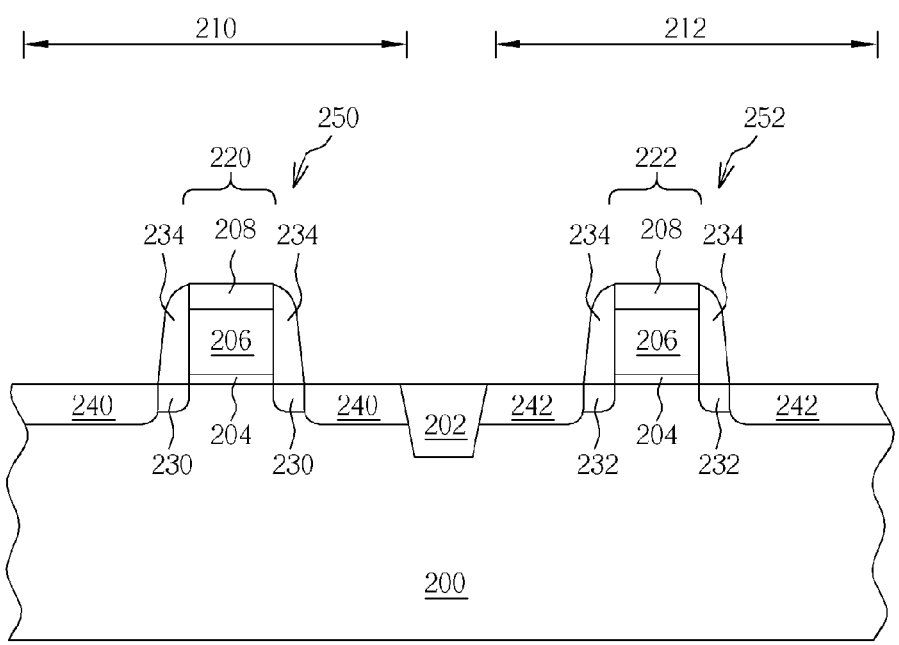

Please refer to FIG. 2. An etching process is performed to etch the polysilicon layer 206 and the gate dielectric layer 204 through the patterned hard mask layer 208. Thus a first gate 220 and a second gate 222 are respectively formed in the first active region 210 and the second active region 212. Please refer to FIG. 2 again. Then, ion implantations with different conductive type ions are sequentially performed to form a first light doped drain (LDD) 230 in the substrate 200 respectively at two sides of the first gate 220 and a second LDD 232 in the substrate 200 at two sides of the second gate 222. And spacers 234 are respectively formed on sidewalls of the first gate 220 and the second gate 222. The spacers 234 can be an ONO offset spacer formed with bis(tert-butylamino)silane (BTBAS) serving as precursor. Next, ion implantations with different conductive type ions are sequentially performed to form a first source/drain 240 in the substrate 200 at two sides of the first gate 220 and a second source/drain 242 in the substrate 200 at two sides of the second gate 222. Thus a first conductive type transistor 250 and a second conductive type transistor 252 are formed respectively in the first active region 210 and the second active region 220. Additionally, selective epitaxial growth (SEG) method can be utilized to form the first source/drain 240 and the second source/drain 242 in the preferred embodiment. For example, when the first conductive type transistor 250 is an NMOS transistor and the second conductive type transistor 252 is a PMOS transistor, epitaxial silicon layers with SiC and SiGe can be used to form the first source/drain 240 and the second source/drain 242, respectively. SEG method is applied in the preferred embodiment for further improving drain induced barrier lowering (DIBL) and punchthrough effect and reducing off-state current leakage and power consumption.

Figure 3:
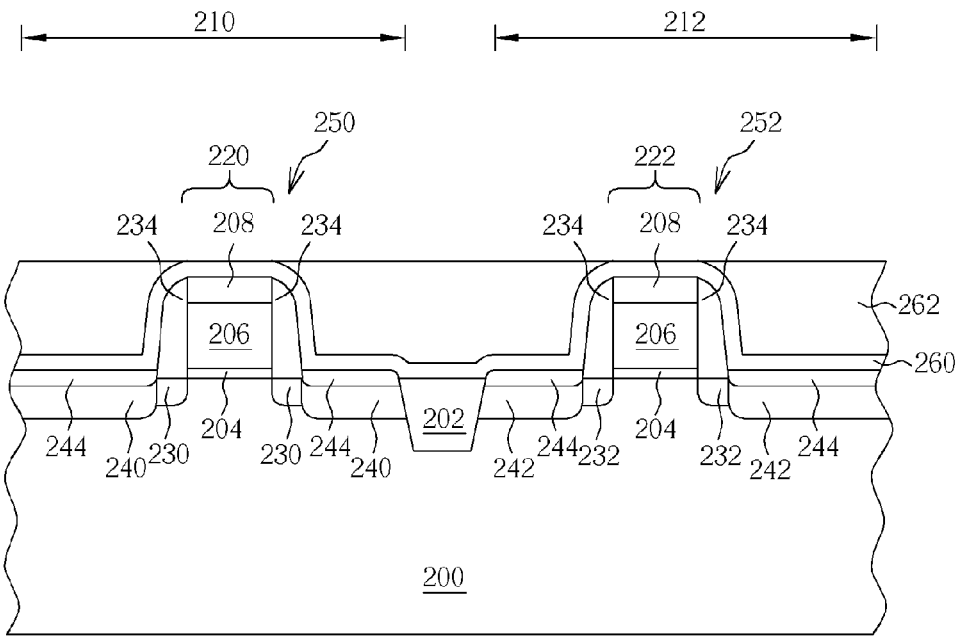
Figure 4:
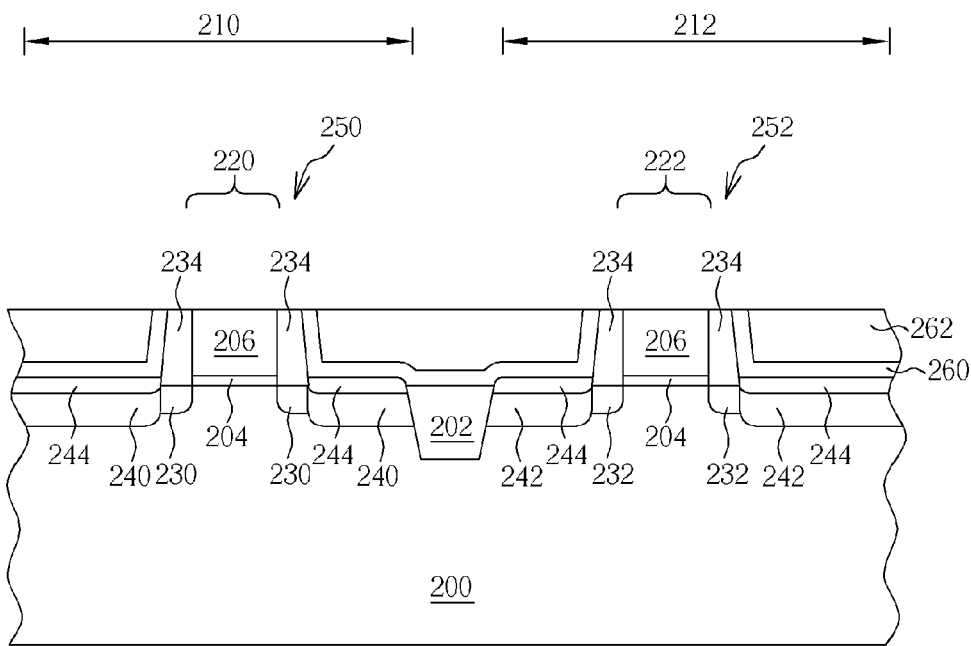

Please refer to FIGS. 3 and 4. After forming the first conductive type transistor 250 and the second conductive type transistor 252, a salicide process is performed to form salicide layers 244 respectively on surfaces of the first source/drain 240 and the second source/drain 242, and followed by sequentially forming a layer 260 with BTBAS serving as precursor and a dielectric layer 262 on the substrate 200. Then, the dielectric layer 262 is planarized to expose the gate conductive layers 206 of the first gate 220 and the second gate 222 by a first planarization process comprising a CMP process, as shown in FIG. 4. However, to prevent the dielectric layer 262 and the layer 260 from excessive planarizing that may cause damage to the profiles of the first gate 220 and the second gate 222, the CMP process can be stopped at the layer 260, which serving as etch stop layer, as shown in FIG. 3.

Please refer to FIG. 4. After the CMP process, the first planarization process further comprises an etching back process used to remove the etch stop layer 260, the patterned hard mask layer 208 covering the first gate 220 and the second gate 222, portions of the spacers 234, and a portion of the dielectric layer 262 to expose the polysilicon layers 206 of the first gate 220 and the second gate 222. The etching back process can be a wet etching process comprising diluted HF (DHF) and phosphoric acid ($H_3PO_4$), or a dry etching process comprising $SF_6$, perfluoro ethane ($C_2F_6$), fluoroform ($CH_3F$), $O_2$, $CO_2$, He, and Ar.

Figure 5:
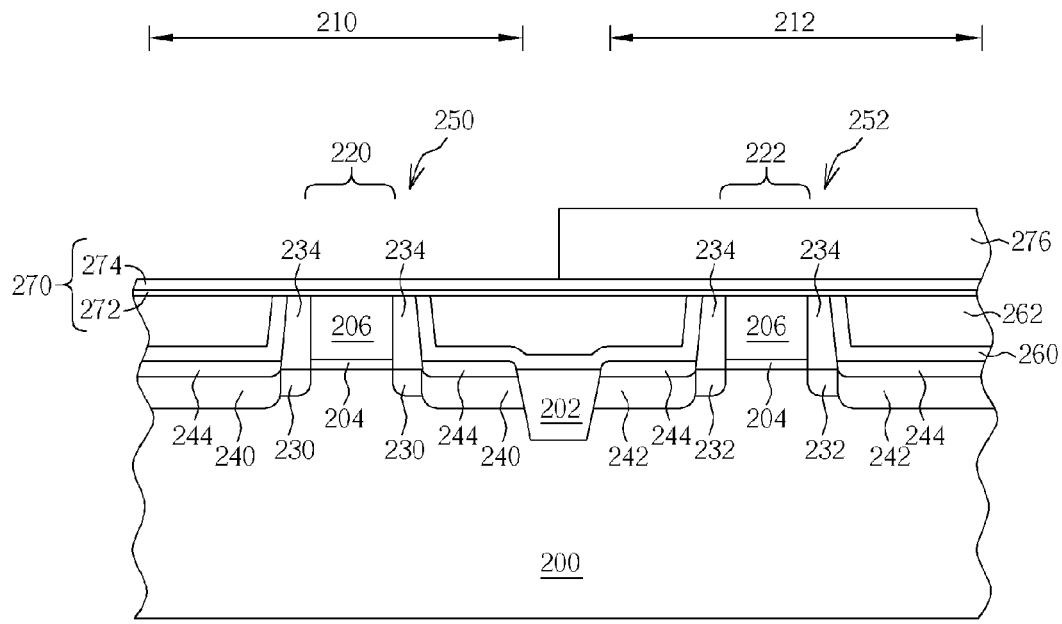

Please refer to FIG. 5. Then, a blocking layer 270 is formed on the substrate 200. The blocking layer 270 can be a single layer comprising amorphous carbon (APF) or be a multi-layer comprising at least a silicon oxide layer 272 and a silicon nitride layer 274 as shown in FIG. 5. A ratio between a thickness of the silicon oxide layer 272 and a thickness of the silicon nitride layer 274 is about 1:3. For example, the thickness of the silicon oxide layer 272 is 100 angstroms and the thickness of the silicon nitride layer 274 is 300 angstroms.

Figure 6:
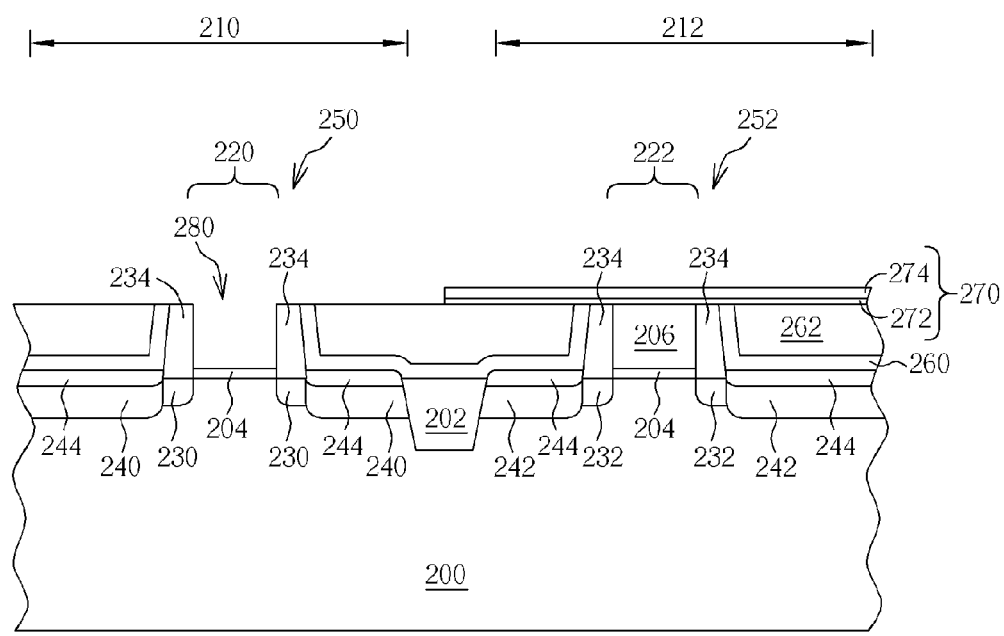

Please refer to FIGS. 5-6. A photoresist 276 is used to pattern the blocking layer 270 and to remove a portion of the blocking layer 270 covering the first conductive type transistor 250 in the first active region 210. Thus the polysilicon layer 206 of the first gate 220 is exposed. Then, a first etching process is performed to remove the polysilicon layer 206 of the first gate 220 to form a first opening 280 in the first active region 210. It is noteworthy that the patterned blocking layer 270 is used to protect the polysilicon layer 206 of the second gate 222 from being damaged in the first etching process.

Figure 7:
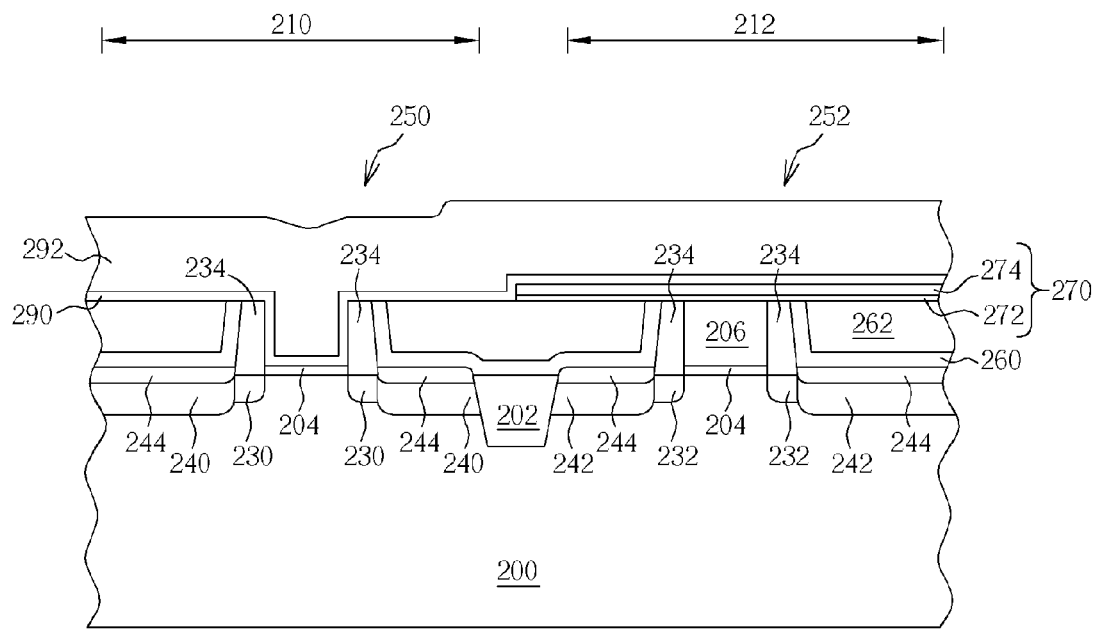

Please refer to FIG. 7. Then, a first metal layer 290 and a second metal layer 292 are sequentially formed in the first opening 280. The first metal layer 290 comprises MoAlN, W, MoN, TaCNO, or WN. It is observed that the gap-fill ability of the abovementioned metal material is inferior, therefore the second metal layer 292 serving as the main material is provided to fill the first opening 280 in order to avoid seam while the first metal layer 290 is used to adjust work function in the preferred embodiment. The second metal layer 292 comprises Al, Ti, Ta, W, Nb, Mo, TiN, TiC, TaN, Ti/W, or Ti/TiN. Furthermore, to prevent the gate dielectric layer 204 from diffusion or reacting with the first metal layer 290, a barrier layer (not shown) can be formed before forming the first metal layer 290. The barrier layer comprises refractory, noble, and lanthanide series elements such as Ti, Ta, Mo, Ru, and W and their aluminates and silicates and nitrogen or carbon incorporated, such as TiN, TaN, TaSiN, TaC, MoAlN, etc.

Figure 8:
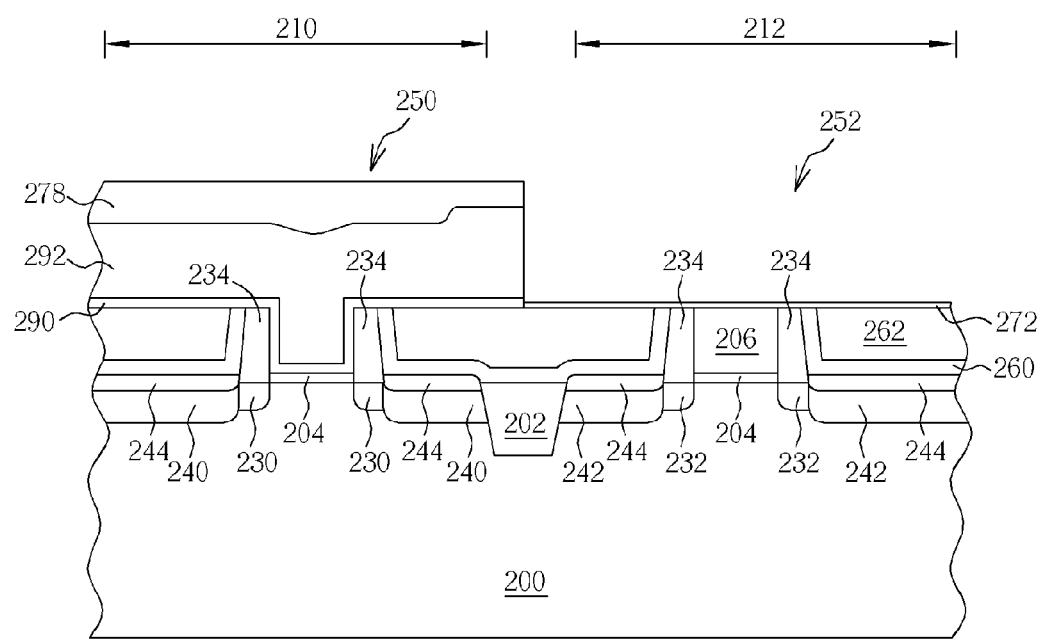

Please refer to FIG. 8. Another photoresist 278 is formed to cover the first active region 210, followed by performing a dry etching process to remove the first metal layer 290 and the second metal layer 292 covering the second conductive type transistor 252, and the silicon nitride layer 274 with the silicon oxide layer 272 serving as a stop layer in the second active region 212. The dry etching process can comprise $Cl_2$, boron trichloride ($BCl_3$), $SF_6$, He, and Ar.

Figure 9:
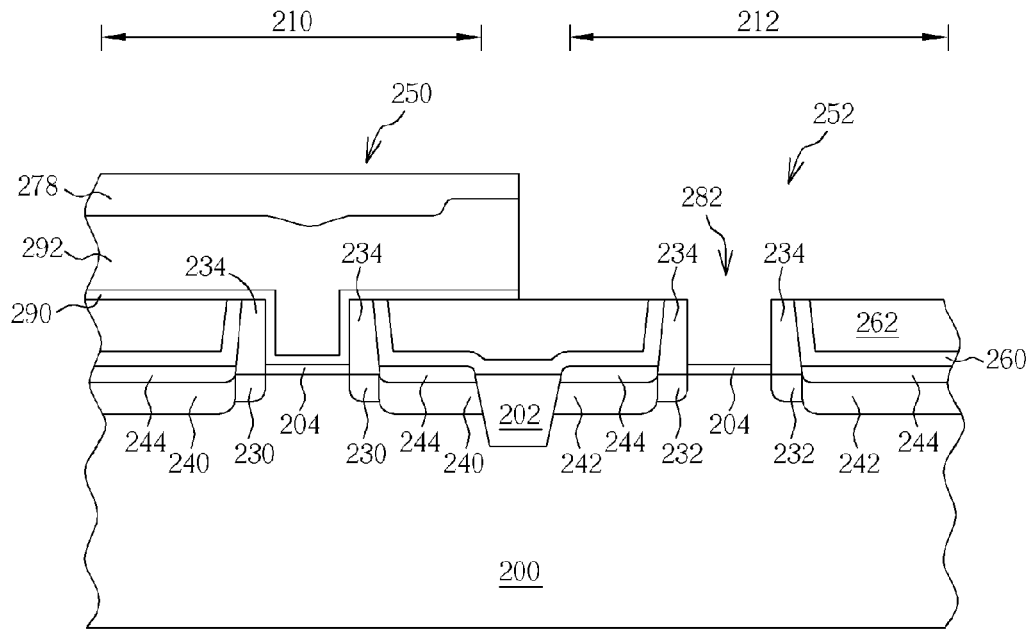

Please refer to FIG. 9. The patterned blocking layer 270 covering the second conductive type transistor 252 in the second active region 212 is then removed. That is, the silicon oxide layer 272 is removed. Thus, the polysilicon layer 206 of the second gate 222 is exposed. Next, a second etching process is performed to remove the polysilicon layer 206 of the second gate 222 to form a second opening 282 in the second active region 252.

Figure 10:
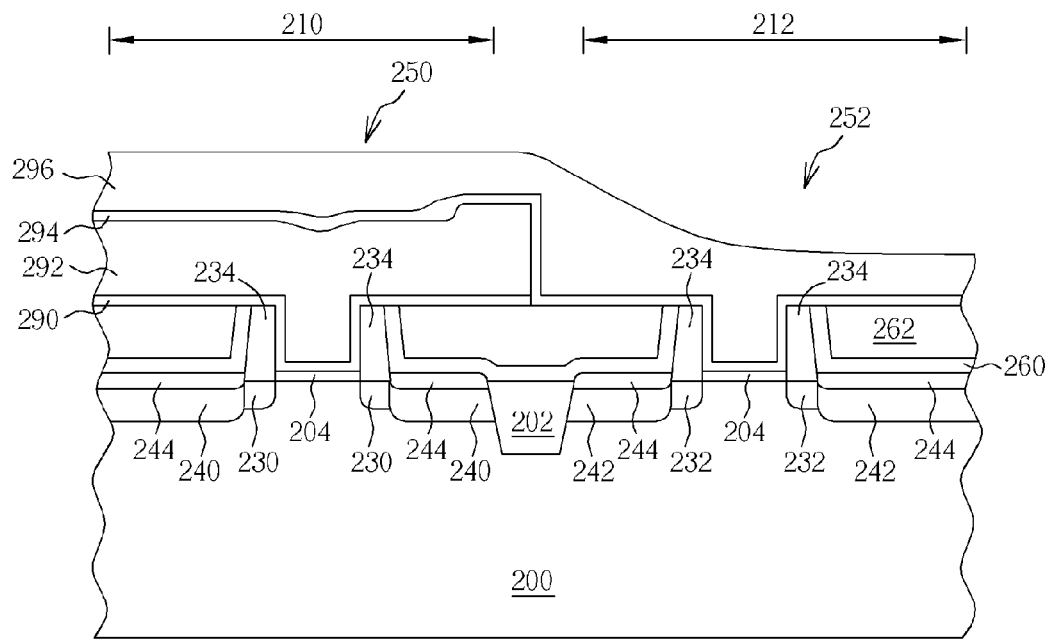

Please refer to FIG. 10. A third metal layer 294 and a fourth metal layer 296 are sequentially formed in the second opening 282. The third metal layer 294 comprises TaC. Since gap-fill ability of the third metal layer 292 is inferior, the fourth metal layer 296 comprising Al, Ti, Ta, W, Nb, Mo, TiN, TiC, TaN, Ti/W, or Ti/TiN is used to be the main gap-filling material to avoid seam. And a barrier layer (not shown) as mentioned above can be formed in between the gate dielectric layer 204 and the third metal layer 294.

According to another preferred embodiment of the present invention, a third etching process and a fourth etching process are performed respectively after the first and the second etching processes to remove the gate dielectric layer 204 when the gate dielectric layer 204 is silicon oxide or silicon oxynitride layer. And steps of re-forming a high-K gate dielectric layer are performed respectively after the third and the fourth etching processes for replacing the conventional gate oxide layer. The high-K gate dielectric layers formed in the first opening 280 and the second opening 282 are used to decrease physical limit thickness and obtain equivalent capacitor in an identical EOT.

It is noteworthy that, in this preferred embodiment, high-K gate dielectric layer is adopted in the first conductive type transistor 250 and the second conductive type transistor 252. And after the first etching process and the second etching process, the dielectric layers 204 comprising high-K material are respectively exposed at bottoms of the first opening 280 and second opening 282. It is well-known that an interface layer (not shown) is conventionally to be formed before forming the gate dielectric layer 204 having high-K material for improving mobility of the carriers in the channel region. The interface layer can be a silicon oxide layer, a silicon oxynitride layer or a silicon nitride layer formed by combination reactions or by being heated to 850° C. Because the gate dielectric layer 204 is not removed in the preferred embodiment, damage to the interface layer is prevented. And reformation of the high-K gate dielectric layer in the first and second openings 280 and 282 that are in a tendency toward 45-nm generation and consideration of monitoring thickness control and uniformity of such a thin layer can be omitted.

Figure 11:
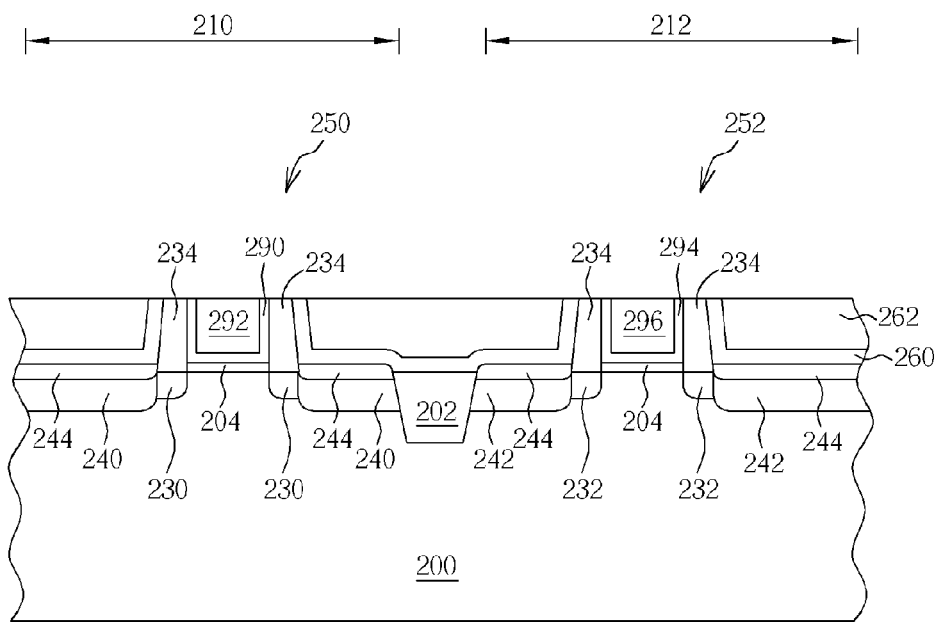
Figure 12:
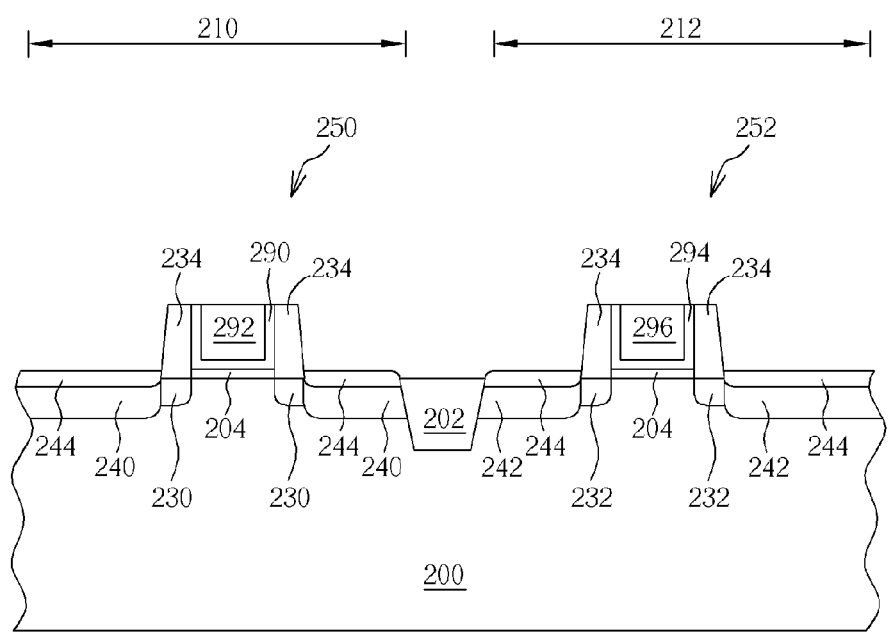

Please refer to FIG. 11. After forming the fourth metal layer 296, a second planarization process is performed to remove unnecessary first metal layer 290, second metal layer 292, third metal layer 294, and fourth metal layer 296 to obtain an even surface and to complete the metal gates of the first conductive type transistor 250 and the second conductive type transistor 252.

In the preferred embodiment, the dielectric layer 262 serving as an inter-layer dielectric (ILD) layer can comprise silicon oxide, doped silicon oxide, phosphosilicate glass (PSG), or borophosphosilicate glass (BPSG). The dielectric layer 262 further can comprises oxide formed by high aspect ratio process (HARP). HARP oxide layer is conventionally used to be a sacrifice layer. Therefore when the dielectric layer 262 comprises HARP oxide, selective strain scheme (SSS) can be applied in the preferred embodiment to improve driving current of the transistors. Please refer to FIG. 12. After the second planarization process, different etching processes are sequentially performed to remove the dielectric layer 262 and the etch stop layer 260 to expose the first conductive type transistor 250 and the second conductive type transistor 252 on the substrate 200.

Figure 13:
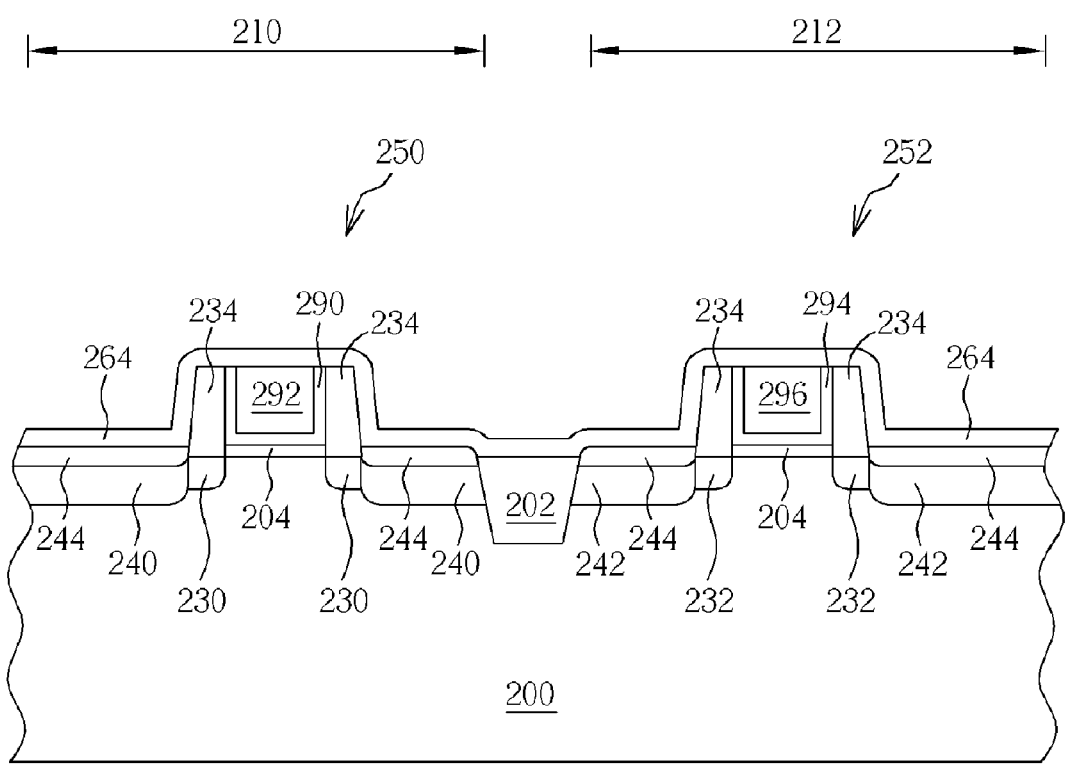

Please refer to FIG. 13. After removing the dielectric layer 262 and the etch stop layer 260, a contact hole etch stop (CESL) layer 264 is formed on the substrate 200. The CESL layer 264 serves as the selective strain scheme by providing a stress generated by treating with heat or UV light in the preferred embodiment. The application of the selective strain scheme effectively improves performance of the first conductive type transistor 250 and the second conductive type transistor 252.

According to the preferred embodiment, the first conductive type transistor 250 is an NMOS transistor and the second conductive type transistor 252 is a PMOS transistor under a consideration of smaller heat budget of the PMOS transistor. However, the order for manufacturing the two different conductive type transistors is not limited and can be alternatively exchanged. The point is that both of the first conductive type transistor 250 and the second conductive type transistor 252 are formed by gate last process, therefore high-temperature steps such as annealing used for forming the LDD or the source/drain and thermal process for forming the salicide have been performed already, and thus metal layers filling in the first and second opening 280 and 282 will not be affected by the high heat budget needed in the abovementioned processes. Consequently, $V_{fb}$ roll-off issue of the NMOS device and the PMOS device is improved, and a wider material choice is provided. Furthermore, selective strain scheme (SSS) provided by CESL can be applied in the present invention to further improve performance of the MOS device.

Those skilled in the art will readily observe that numerous modifications and alterations of the device and method may be made while retaining the teachings of the invention.

What is claimed is:

1. A method for manufacturing a CMOS device having dual metal gate comprising steps of:
    providing a substrate having a first conductive type transistor, a second conductive type transistor, and a dielectric layer covering the first conductive type transistor and the second conductive type transistor formed thereon;
    planarizing the dielectric layer to expose gate conductive layers of a first gate of the first conductive type transistor and of a second gate of the second conductive type transistor;
    forming a patterned blocking layer covering the second conductive type transistor and exposing the first conductive type transistor on the substrate;
    performing a first etching process to remove the gate conductive layer of the first gate to form a first opening;
    sequentially forming a first metal layer and a second metal layer in the first opening; and
    removing the patterned blocking layer covering the second conductive type transistor after forming the first metal layer and the second metal layer.

2. The method of claim 1 further comprising steps for forming the first conductive type transistor and the second conductive type transistor:
    sequentially forming a gate dielectric layer, the gate conductive layer, and a patterned hard mask layer on the substrate;
    performing an etching process to etch the gate conductive layer and the gate dielectric layer through the patterned hard mask layer to form the first gate and the second gate respectively;
    forming a first light doped drain (LDD) and a second LDD in the substrate at two sides of the first gate and the second gate, respectively;
    forming a spacer on sidewalls of the first gate and the second gate, respectively; and
    forming a first source/drain and a second source/drain in the substrate at two sides of the first gate and the second gate, respectively.

3. The method of claim 1, wherein the step of planarizing the dielectric layer comprises a chemical mechanical polishing (CMP) process and an etching back process.

4. The method of claim 1, wherein the patterned blocking layer is a multi-layer.

5. The method of claim 1, wherein the patterned blocking layer comprise amorphous carbon (APF).

6. The method of claim 1, wherein the first metal layer comprises MoAlN, W, MoN, TaCNO, or WN.

7. The method of claim 1 further comprising a step of removing the first metal layer and the second metal layer covering the second conductive type transistor performed after forming the first metal layer and the second metal layer.

8. The method of claim 1, wherein the dielectric layer serves as an inter-layer dielectric (ILD) layer.

9. The method of claim 2 further comprising a step of performing a salicide process to form salicide layers respectively on surfaces of the first source/drain and the second source drain after forming the first conductive type transistor and the second conductive type transistor.

10. The method of claim 2 further comprising steps of:
    performing a second etching process to remove the gate conductive layer of the second gate to form a second opening; and
    sequentially forming a third metal layer and a fourth metal layer in the second opening.

11. The method of claim 10 further comprising steps of:
    performed a third etching process and a fourth etching process respectively after the first etching process and the second etching process for removing the gate dielectric layer; and
    forming a high-K gate dielectric layer in the first opening and a high-K gate dielectric layer in the second opening respectively after the third etching process and the fourth etching process.

12. The method of claim 10, wherein the gate dielectric layer is a high-K gate dielectric layer.

13. The method of claim 10, wherein the third metal layer comprises TaC.

14. The method of claim 10, wherein the second metal layer and the fourth metal layer respectively comprise Al, Ti, Ta, W, Nb, Mo, TiN, TiC, TaN, Ti/W, or Ti/TiN.

15. The method of claim 10 further comprising a step of performing a planarization process to remove unnecessary first metal layer, second metal layer, third metal layer, and the fourth metal layer after forming the fourth metal layer.

16. The method of claim 12, wherein the high-K gate dielectric layers are exposed at bottoms of the first opening and the second opening respectively after the first etching process and second etching process.

17. The method of claim 15 further comprising a step of removing the dielectric layer after the planarization process.

18. The method of claim 17 further comprising a step of forming a contact hole etch stop layer (CESL) on the substrate after removing the dielectric layer.

19. The method of claim 4, wherein the patterned blocking layer comprises at least a silicon oxide layer and a silicon nitride layer.

20. The method of claim 19, wherein a ratio between a thickness of the silicon oxide layer and a thickness of the silicon nitride layer is about 1:3.

21. A method for manufacturing a CMOS device having dual metal gate comprising steps of:
providing a substrate having a first conductive type transistor, a second conductive type transistor, and a dielectric layer covering the first conductive type transistor and the second conductive type transistor formed thereon;
planarizing the dielectric layer to expose gate conductive layers of a first gate of the first conductive type transistor and of a second gate of the second conductive type transistor;
forming a patterned blocking layer covering the second conductive type transistor and exposing the first conductive type transistor on the substrate, the patterned blocking layer comprising at least a silicon oxide layer and a silicon nitride layer;
performing a first etching process to remove the gate conductive layer of the first gate to form a first opening;
sequentially forming a first metal layer and a second metal layer in the first opening; and
removing the patterned blocking layer covering the second conductive type transistor.

22. The method of claim 21 further comprising steps for forming the first conductive type transistor and the second conductive type transistor:
sequentially forming a gate dielectric layer, the gate conductive layer, and a patterned hard mask layer on the substrate;
performing an etching process to etch the gate conductive layer and the gate dielectric layer through the patterned hard mask layer to form the first gate and the second gate respectively;
forming a first light doped drain (LDD) and a second LDD in the substrate at two sides of the first gate and the second gate, respectively;
forming a spacer on sidewalls of the first gate and the second gate, respectively; and
forming a first source/drain and a second source/drain in the substrate at two sides of the first gate and the second gate, respectively.

23. The method of claim 22 further comprising a step of performing a salicide process to form salicide layers respectively on surfaces of the first source/drain and the second source drain after forming the first conductive type transistor and the second conductive type transistor.

24. The method of claim 22 further comprising steps of:
performing a second etching process to remove the gate conductive layer of the second gate to form a second opening; and
sequentially forming a third metal layer and a fourth metal layer in the second opening.

25. The method of claim 21, wherein the step of planarizing the dielectric layer comprises a chemical mechanical polishing (CMP) process and an etching back process.

26. The method of claim 21, wherein the patterned blocking layer is a multi-layer.

27. The method of claim 21, wherein a ratio between a thickness of the silicon oxide layer and a thickness of the silicon nitride layer is about 1:3.

28. The method of claim 21, wherein the first metal layer comprises MoAlN, W, MoN, TaCNO, or WN.

29. The method of claim 21 further comprising a step of removing the first metal layer and the second metal layer covering the second conductive type transistor performed after forming the first metal layer and the second metal layer.

30. The method of claim 21, wherein the dielectric layer serves as an inter-layer dielectric (ILD) layer.

31. The method of claim 24 further comprising steps of:
performed a third etching process and a fourth etching process respectively after the first etching process and the second etching process for removing the gate dielectric layer; and
forming a high-K gate dielectric layer in the first opening and a high-K gate dielectric layer in the second opening respectively after the third etching process and the fourth etching process.

32. The method of claim 24, wherein the gate dielectric layer is a high-K gate dielectric layer.

33. The method of claim 32, wherein the high-K gate dielectric layers are exposed at bottoms of the first opening and the second opening respectively after the first etching process and second etching process.

34. The method of claim 24, wherein the third metal layer comprises TaC.

35. The method of claim 24, wherein the second metal layer and the fourth metal layer respectively comprise Al, Ti, Ta, W, Nb, Mo, TiN, TiC, TaN, Ti/W, or Ti/TiN.

36. The method of claim 24 further comprising a step of performing a planarization process to remove unnecessary first metal layer, second metal layer, third metal layer, and the fourth metal layer after forming the fourth metal layer.

37. The method of claim 36 further comprising a step of removing the dielectric layer after the planarization process.

38. The method of claim 37 further comprising a step of forming a contact hole etch stop layer (CESL) on the substrate after removing the dielectric layer.

39. A method for manufacturing a CMOS device having dual metal gate comprising steps of:
providing a substrate having a first conductive type transistor, a second conductive type transistor, and a dielectric layer covering the first conductive type transistor and the second conductive type transistor formed thereon;
planarizing the dielectric layer to expose gate conductive layers of a first gate of the first conductive type transistor and of a second gate of the second conductive type transistor;

forming a patterned blocking layer covering the second conductive type transistor and exposing the first conductive type transistor on the substrate, the patterned blocking layer comprising amorphous carbon (APF);

performing a first etching process to remove the gate conductive layer of the first gate to form a first opening;

sequentially forming a first metal layer and a second metal layer in the first opening; and removing the patterned blocking layer covering the second conductive type transistor.

40. The method of claim 39 further comprising steps for forming the first conductive type transistor and the second conductive type transistor:

sequentially forming a gate dielectric layer, the gate conductive layer, and a patterned hard mask layer on the substrate;

performing an etching process to etch the gate conductive layer and the gate dielectric layer through the patterned hard mask layer to form the first gate and the second gate respectively;

forming a first light doped drain (LDD) and a second LDD in the substrate at two sides of the first gate and the second gate, respectively;

forming a spacer on sidewalls of the first gate and the second gate, respectively; and forming a first source/drain and a second source/drain in the substrate at two sides of the first gate and the second gate, respectively.

41. The method of claim 40 further comprising steps of:

performing a second etching process to remove the gate conductive layer of the second gate to form a second opening; and sequentially forming a third metal layer and a fourth metal layer in the second opening.

42. The method of claim 39, wherein the step of planarizing the dielectric layer comprises a chemical mechanical polishing (CMP) process and an etching back process.

43. The method of claim 39, wherein the patterned blocking layer is a multi-layer.

44. The method of claim 39, wherein the first metal layer comprises MoAlN, W, MoN, TaCNO, or WN.

45. The method of claim 39 further comprising a step of removing the first metal layer and the second metal layer covering the second conductive type transistor performed after forming the first metal layer and the second metal layer.

46. The method of claim 39, wherein the dielectric layer serves as an inter-layer dielectric (ILD) layer.

47. The method of claim 40 further comprising a step of performing a salicide process to form salicide layers respectively on surfaces of the first source/drain and the second source drain after forming the first conductive type transistor and the second conductive type transistor.

48. The method of claim 41 further comprising steps of:

performed a third etching process and a fourth etching process respectively after the first etching process and the second etching process for removing the gate dielectric layer; and forming a high-K gate dielectric layer in the first opening and a high-K gate dielectric layer in the second opening respectively after the third etching process and the fourth etching process.

49. The method of claim 41, wherein the gate dielectric layer is a high-K gate dielectric layer.

50. The method of claim 41, wherein the third metal layer comprises TaC.

51. The method of claim 41, wherein the second metal layer and the fourth metal layer respectively comprise Al, Ti, Ta, W, Nb, Mo, TiN, TiC, TaN, Ti/W, or Ti/TiN.

52. The method of claim 41 further comprising a step of performing a planarization process to remove unnecessary first metal layer, second metal layer, third metal layer, and the fourth metal layer after forming the fourth metal layer.

53. The method of claim 49, wherein the high-K gate dielectric layers are exposed at bottoms of the first opening and the second opening respectively after the first etching process and second etching process.

54. The method of claim 52 further comprising a step of removing the dielectric layer after the planarization process.

55. The method of claim 54 further comprising a step of forming a contact hole etch stop layer (CESL) on the substrate after removing the dielectric layer.

* * * * *